United States Patent
Itoh et al.

[11] 3,931,538
[45] Jan. 6, 1976

[54] SIGNAL DETECTOR FOR A SEMICONDUCTOR MEMORY DEVICE

[75] Inventors: Kiyoo Itoh, Kodaira; Keisuke Hashizume, Hachiooji; Katsuhiro Shimohigashi, Kokubunji, all of Japan

[73] Assignee: Hitachi, Ltd., Japan

[22] Filed: Oct. 9, 1973

[21] Appl. No.: 404,325

[30] Foreign Application Priority Data
Oct. 9, 1972  Japan................ 47-100683

[52] U.S. Cl.............. 307/235 R; 307/238; 307/279
[51] Int. Cl.².................... H03K 5/20; H03K 3/26
[58] Field of Search ........... 307/235, 238, 279, 291, 307/289

[56] References Cited
UNITED STATES PATENTS

| | | | |
|---|---|---|---|
| 3,041,477 | 6/1962 | Budts et al. | 307/291 |
| 3,493,786 | 2/1970 | Ahrons et al. | 307/238 |
| 3,510,689 | 5/1970 | Baker | 307/238 |
| 3,539,839 | 11/1970 | Igarashi | 307/279 |
| 3,588,844 | 6/1971 | Christensen | 307/279 |
| 3,683,206 | 8/1972 | Haraszti | 307/279 |

Primary Examiner—Stanley D. Miller, Jr.
Attorney, Agent, or Firm—Craig & Antonelli

[57] ABSTRACT

Signal detector consisting of a flip-flop that is provided with at least a pair of inverters with the output of each inverter connected with the input of the other through a positive feedback loop and means to trigger said flip-flop at arbitrary times, the input of one of said inverters being connected to the signal line with both inverters designed to be electrically unbalanced between themselves.

13 Claims, 6 Drawing Figures

SIGNAL DETECTOR FOR A SEMICONDUCTOR MEMORY DEVICE

BACKGROUND OF THE INVENTION

This invention relates to a signal detector, for example, to detect signals on the sense lines from a semiconductor memory.

In the semiconductor memory, the higher the density of the integrated circuit, the smaller the area of a memory cell and the larger the capacity of the load line. A smaller area for the memory cell means that the driving power of such a cell becomes lower. As the integration of the circuit progresses, therefore, it becomes necessary for a memory cell with a small driving power to drive a load with a large load capacity (for example, the capacity of the sense line), so that signals that appear at the output become necessarily small and it takes time for signals with a sufficient amplitude to appear on the load line, thereby lowering the read out speed of the memory.

DETAILED DESCRIPTION OF THE INVENTION

Figure 1:
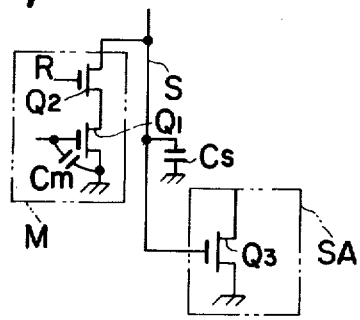
FIG. 1 is a schematic circuit diagram of a conventional sense amplifier.
Figure 2:
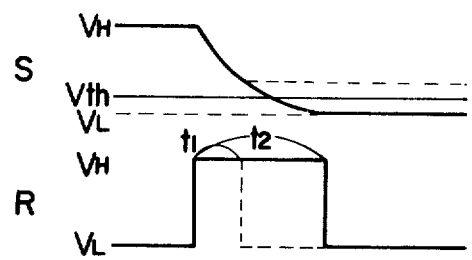
FIG. 2 illustrates a timing chart for signals of the circuit of FIG. 1.

These problems of the prior art are explained below by referring to the example of the conventional sense amplifier as illustrated in FIG. 1. The information in the form of a signal level of 1 or 0 is stored in memory cell M depending on whether a high level $V_H$ or a low level $V_L$ voltage is applied across capacitor Cm on the gate of the MOS transistor $Q_1$. Supposing that such an applied voltage is set at the high level $V_H$, the sense line S that is charged beforehand at the high level $V_H$ starts to discharge through MOS transistors $Q_1$ and $Q_2$ to the low level $V_L$ (ground level in the figure) as soon as readout line R is set at the high level $V_H$. Such a voltage change on the sense line S is detected by the MOS transistor $Q_3$ of the sense amplifier SA. On the other hand, supposing that the gate voltage of transistor $Q_1$ is equivalent to the low level $V_L$, the voltage of the sense line S is left at the high level $V_H$ since the transistor $Q_1$ is nonconducting. Thus, the condition required for the state 1 to be detected at transistor $Q_3$ is that, with the gate voltage of transistor $Q_1$ set at the high level $V_H$, the voltage of sense line S is lowered by discharge below the threshold voltage $V_{th}$ of the transistor $Q_3$. As is clear from FIG. 2, therefore, for a sufficient pulse width of the signal on the readout line R, the time period $t_1$ is not enough, but time period $t_2$ must be selected, whereby the voltage on the sense line S can drop lower than $V_{th}$. The time required for such discharge is proportional to the capacity $C_s$ of the sense line and the area of the transistor circuit on the memory cell M. Since a large capacity for the memory is associated with a large value of capacity $C_s$ and small areas for the transistors $Q_1$ and $Q_2$, it is not rare that the time of discharge accounts for more than half of the access time for the memory. Speed-up of the readout of the memory is therefore not feasible with the conventional amplifier.

An object of the present invention is to provide a signal detector including a flip-flop which is capable of eliminating the difficulties mentioned above.

Embodiments of this invention are described in detail below in reference to several exemplary circuits.

Figure 3:
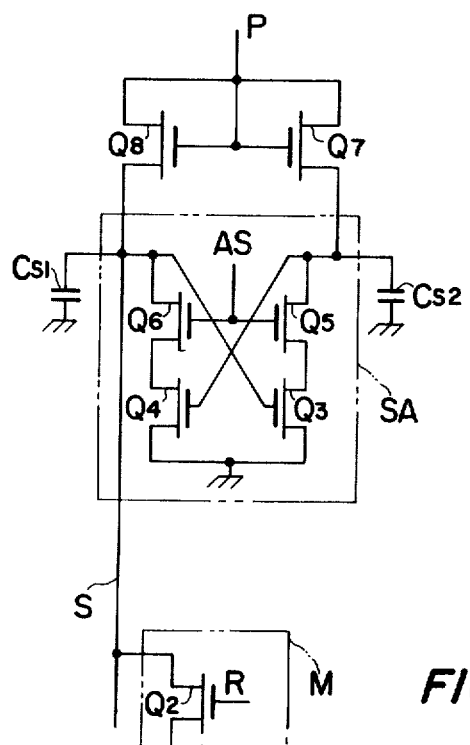
FIG. 3 illustrates a circuit diagram of an embodiment of a signal detector according to our invention.
Figure 4:
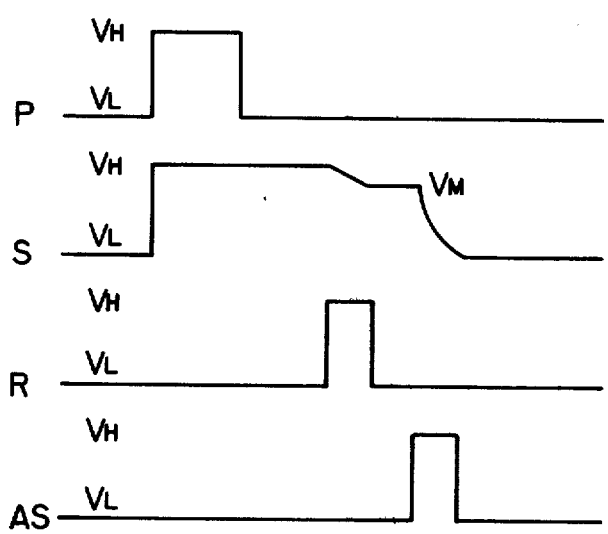
FIG. 4 illustrates a timing chart for signals of the circuit of FIG. 3.

FIG. 3 illustrates an example of the signal detector in accordance with this invention, where it is used as a sense amplifier. In FIG. 3, SA is a sense amplifier comprising a flip-flop that consists of four MOS transistors $Q_3$ to $Q_6$. FIG. 4 illustrates signal waveforms to be observable at respective indicated points P, S, R, and AS expressing the precharge voltage, sense line voltage, readout line voltage, and control signal, respectively.

Now, if the precharge voltage P is set at the high level $V_H$ to make MOS transistors $Q_7$ and $Q_8$ conductive so that the high level $V_H$ is applied to the gates of transistors $Q_3$ and $Q_4$, thereby to make this pair of transistors conductive, both source voltages of the transistors $Q_5$ and $Q_6$ are lowered to the low level $V_L$ (ground level in FIG. 3). With no signal input at the control lead AS, however, transistors $Q_5$ and $Q_6$ are non-conducting, so that the positive feedback loop remains interrupted for the sense amplifier SA. In this state, even if precharge voltage P is set off (i.e., lowered to low level $V_L$), the high impedances of the MOS transistors maintain sense line S at the high level $V_H$ for a long time across capacity $C_{s1}$ of sense line S.

Next, if the content of the memory cell is read out by readout signal R and if the gate voltage of MOS transistor $Q_1$ is equivalent to $V_H$, transistors $Q_1$ and $Q_2$ both conduct and sense line S starts to discharge current from the high level $V_H$ to the low level $V_L$. Then, if control signal AS is switched on after the voltage of sense line S reaches an intermediate level $V_M$ therebetween, the inverter circuit consisting of transistors $Q_4$ and $Q_6$ becomes more conducting than the inverter circuit consisting of transistors $Q_3$ and $Q_5$, for the MOS transistor has a property that the higher the gate voltage, the larger the conductance, i.e., the smaller the dynamic resistance. This is because the gate voltage of transistor $Q_4$ and that of transistor $Q_3$ are equivalent to the high level $V_H$ and intermediate level $V_M$, respectively, at the instant when the control signal AS is switched on. The discharge of current to the low level that is going on along sense line S is therefore accelerated, and with lowering of the gate voltage of transistor $Q_3$ that occurs simultaneously therewith, transistors $Q_3$ and $Q_5$ are more and more driven into the nonconducting state until the drain voltage of transistor $Q_5$, i.e., the gate voltage of transistor $Q_4$, reaches a high voltage level and stays there. That is, the voltage on sense line S is driven acceleratingly from the intermediate level $V_M$ to a low level $V_L$ through the positive feedback loop by control signal AS that is switched on, with a result that sense line S is switched to the low level $V_L$.

Next, supposing that the gate voltage of transistor $Q_1$ that belongs to memory cell M is equivalent to the low level $V_L$, transistor $Q_1$ stays non-conducting even with a readout signal on lead R, so that the voltage on sense line S is kept at the high level $V_H$. If sense amplifier SA operates with arrival of a control signal at lead AS so as to switch sense line S to the low level $V_L$, identification of whether the gate voltage of transistor $Q_1$ lies at a high or a low level cannot be performed accurately.

In order to discern between the "1" and "0" states of memory cell M with the sense amplifier SA with sufficient margin, therefore, supposing that the gate voltage of transistor $Q_1$ is set equal to low level $V_L$, the source voltage of transistor $Q_7$ must be switched to the low level $V_L$ by the incoming signal at control lead AS, while the voltage of sense line is maintained at the high level $V_H$ that has originated from precharge P. Such a requirement can be satisfied if it is arranged that the inequality $C_{s1} > C_{s2}$ holds, where $C_{s2}$ is the capacity between the source of transistor $Q_7$ and ground. Under such conditions and supposing that the gate voltage of transistor $Q_1$ is set at the low level $V_L$, the voltage of sense line S is difficult to change because the capacity $C_{s1}$ is larger than $C_{s2}$, even if the control signal AS is introduced to activate the feedback loop of the flip-flop after the voltage of sense line S and the source voltage of transistor $Q_7$ are both elevated to a high level $V_H$ by the precharge voltage P. On the other hand, the source voltage of transistor $Q_7$ is more liable to change, so that it results from the positive feedback that the voltage on the sense line S is maintained at a high level $V_H$, while the source voltage of transistor $Q_7$ is switched to the low level $V_L$. It follows necessarily that with the gate voltage of transistor $Q_1$ set at the high level $V_H$, control signal AS can be successfully applied after the voltage on sense line S reaches a voltage level (expressed above by $V_M$) that can overcome the unbalance between said capacities.

As described above, such a sense amplifier can detect small voltage changes on the sense line at high speed with a positively electrically-unbalanced flip-flop.

Figure 5:
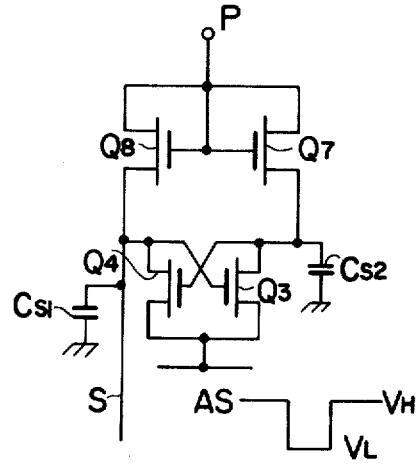
FIGS. 5 and 6 are schematic circuit diagrams of other embodiments of a signal detector according to our invention, respectively.

FIG. 5 illustrates another embodiment of the sense amplifier in accordance with this invention, where the feedback loop of the flip-flop is initially interrupted by fixing control signal AS at the high level $V_H$ until the voltage on sense line S drops to a certain level during the period to read out the voltage from the memory cell. Thereafter, the flip-flop is switched on by setting the control signal at the low level $V_L$. It is noted that transistors $Q_5$ and $Q_6$ are omitted in this example.

Figure 6:
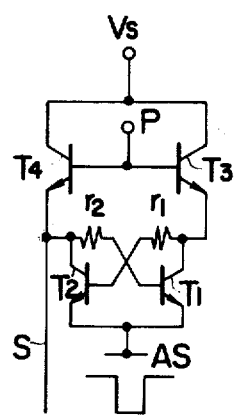

FIG. 6 illustrates one more embodiment of the sense amplifier in accordance with this invention, the flip-flop of which consists of bipolar transistors $T_1$, $T_2$ and resistors $r_1$, $r_2$ and the precharge circuit of which consists of transistors $T_3$, $T_4$, to which are applied the precharge voltage P and supply voltage $V_s$.

As is clear from the operating requirements of the circuit, it is only required that the flip-flop is designed in a proper state of unbalance. Thus, instead of the unbalance between capacitors the unbalance of conductance gm between transistors comprising the flip-flop or the unbalance of the precharged voltage level between sense line S and the emitter of transistor $T_3$ suffices for this type of circuit.

Descriptions have been given for a signal detector used as a sense amplifier in all the above embodiments, but the detector is not limited to such use. As a matter of course, it is usable in general for the high-speed detection of voltage changes on the signal line.

What is claimed is:

1. A signal detector comprising: a flip-flop formed of at least a pair of inverters, the output of each inverter being connected to the input of the other inverter through a positive feedback loop; and means for selectively actuating said feedback loop of said flip-flop at a predetermined time; the input of one of said pair of inverters being connected to a signal line, and said pair of inverters being positively electrically unbalanced; said pair of inverters including first, second, third and fourth transistors each having first, second and third terminals; said first terminals of said first and third transistors each being connected to said actuating means; said second terminals of said first and third transistors being connected to said third terminals of said second and fourth transistors, respectively; said third terminals of said first and third transistors being connected to said first terminals of said fourth and second transistors, respectively; said first terminal of said fourth transistor being connected to said signal line; and said second terminals of said second and fourth transistors being grounded.

2. A signal detector according to claim 1, in which said first, second, third, and fourth transistors comprise MOS transistors.

3. A signal detector according to claim 1, wherein said actuating means comprises a source of control pulses.

4. A signal detector according to claim 1, further comprising a memory cell connected to said signal line for controlling the discharging thereof; and means for selectively applying a readout signal to said memory cell at a first predetermined time to initiate the discharge of said signal line; wherein said actuating means, when actuated, accelerates said discharge of said sense line initiated by said selectively applying means.

5. A sensing circuit for a memory arrangement having at least one sense line, comprising
   a flip-flop formed of at least a pair of inverter circuits, the output of each inverter circuit being connected to the input of the other inverter circuit through a positive feedback loop, the input of one of said inverter circuits being connected to said sense line,
   means for selectively applying a voltage to the inputs of said inverter circuits at a first predetermined time,
   means for selectively actuating said feedback loop of said flip-flop at a second predetermined time, and
   a memory cell connected to said sense line for controlling the discharging thereof,
   said pair of inverter circuits being positively electrically unbalanced and including first, second, third and fourth transistors each having first, second and third terminals; said first terminals of said first and third transistors each being connected to said actuating means; said second terminals of said first and third transistors being connected to said third terminals of said second and fourth transistors, respectively; said third terminals of said first and third transistors being connected to said first terminals of said fourth and second transistors, respectively; said first terminal of said fourth transistor being connected to said sense line; and said second terminals of said second and fourth transistors being grounded.

6. A sensing circuit according to claim 5, in which said first, second, third, and fourth transistors comprise MOS transistors.

7. A sensing circuit according to claim 6, wherein said voltage applying means includes fifth and sixth transistors each having first output terminals and an input terminal connected together to a control voltage source and having second output terminals connected to the inputs of respective inverter circuits.

8. A sensing circuit according to claim 7, wherein said pair of inverter circuits are unbalanced by providing unequal capacitance to ground from the outputs of the respective inverter circuits.

9. A sensing circuit for a memory arrangement including only one sense line and at least one memory cell connected thereto, said circuit comprising:
   a flip-flop formed of at least one pair of inverter circuits, the output of each inverter circuit being connected to the input of the other inverter circuit through a positive feedback loop, only the input of one of said inverter circuits being connected to said sense line, and said inverter circuits being positively electrically unbalanced with each other;
   means for selectively applying a voltage to the inputs of said inverter circuits at a first predetermined time to charge said sense line;
   means for selectively applying a readout signal to said memory cell at a second predetermined time to initiate the discharge of said sense line; and
   means for selectively actuating said feedback loop of said flip-flop at a third predetermined time to accelerate said discharge of said sense line.

10. A sensing circuit for a memory arrangement including at least one sense line and at least one memory cell connected thereto, said circuit comprising:
    a flip-flop formed of at least one pair of inverter circuits, the output of each inverter circuit being connected to the input of the other inverter circuit through a positive feedback loop, only the input of one of said inverter circuits being connected to said sense line and said inverter circuits being positively electrically unbalanced with each other;
    means for selectively applying a voltage to the inputs of said inverter circuits at a first predetermined time to charge said sense line;
    means for selectively applying a readout signal to said memory cell at a second predetermined time to initiate the discharge of said sense line; and
    means for selectively actuating said feedback loop of said flip-flop at a third predetermined time to accelerate said discharge of said sense line;
    said at least one pair of inverter circuits including first, second, third and fourth transistors each having first, second and third terminals;
    said first terminals of said first and third transistors each being connected to said actuating means;
    said second terminals of said first and third transistors being connected to said third terminals of said second and fourth transistors, respectively;
    said third terminals of said first and third transistors being connected to said first terminals of said fourth and second transistors, respectively;
    said first terminal of said fourth transistor being connected to said sense line; and
    said second terminals of said second and fourth transistors being grounded.

11. A sensing circuit as defined in claim 10, wherein said first, second, third and fourth transistors comprise MOS transistors.

12. A sensing circuit as defined in claim 10, wherein said voltage supplying means includes fifth and sixth transistors each having first output terminals and an input terminal connected together to a control voltage source and having second output terminals connected to the respective inputs of said inverter circuits.

13. A sensing circuit as defined in claim 10, wherein said pair of inverter circuits are unbalanced by providing unequal capacitance to ground from the outputs of the respective inverter circuits.

* * * * *